US010465498B2

(12) United States Patent
Rodgers et al.

(10) Patent No.: US 10,465,498 B2
(45) Date of Patent: Nov. 5, 2019

(54) FAST TEST APPLICATION FOR SHOCK SENSING SUBASSEMBLIES USING SHOCK MODELING SOFTWARE

(71) Applicant: Halliburton Energy Services, Inc., Houston, TX (US)

(72) Inventors: John P. Rodgers, Southlake, TX (US); Timothy S. Glenn, Dracut, MA (US); Marco Serra, Winterhur (CH); John Burleson, Denton, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 374 days.

(21) Appl. No.: 15/104,853

(22) PCT Filed: Dec. 31, 2013

(86) PCT No.: PCT/US2013/078488
§ 371 (c)(1),
(2) Date: Jun. 15, 2016

(87) PCT Pub. No.: WO2015/102619
PCT Pub. Date: Jul. 9, 2015

(65) Prior Publication Data
US 2017/0030186 A1    Feb. 2, 2017

(51) Int. Cl.
*G06G 7/48* (2006.01)
*E21B 47/06* (2012.01)
(Continued)

(52) U.S. Cl.
CPC ............ *E21B 47/06* (2013.01); *E21B 43/116* (2013.01); *E21B 47/065* (2013.01);
(Continued)

(58) Field of Classification Search
None
See application file for complete search history.

(56) References Cited

U.S. PATENT DOCUMENTS

| 4,092,629 | A | * | 5/1978 | Siems | G01V 1/22 340/870.13 |
| 6,367,565 | B1 | | 4/2002 | Hall | |

(Continued)

FOREIGN PATENT DOCUMENTS

WO    2011025471 A1    3/2011

OTHER PUBLICATIONS

Samuel, G. Robello et al., "Field Validation of Transient Swab-Surge Response with Real-Time Downhole Pressure Data", Dec. 2003, SPE/IADC Drilling Conference, SPE Drilling and Completion, Society of Petroleum Engineers. (Year: 2003).*

(Continued)

*Primary Examiner* — Cedric Johnson
(74) *Attorney, Agent, or Firm* — Chamberlain Hrdlicka (57) ABSTRACT

The disclosed embodiments include a system and method in which a plurality of shock sensing subassemblies are arranged within the tool string to monitor the transient response of formation characteristics to various stimuli, including changes in pressure and temperature of a region of a wellbore that is nearby the formation. The systems and methods involve gathering measurements that reflect the transient response and comparing the measured data to predicted data. The results of the comparison can be used to determine formation properties and to refine and improve modeling processes used to generate the predicted data.

25 Claims, 7 Drawing Sheets

(51) Int. Cl.
*E21B 49/00* (2006.01)
*E21B 43/116* (2006.01)
*E21B 49/08* (2006.01)
*G01V 11/00* (2006.01)
*G06F 17/50* (2006.01)
*E21B 33/12* (2006.01)
*E21B 43/14* (2006.01)

(52) U.S. Cl.
CPC ............ *E21B 49/003* (2013.01); *E21B 49/08* (2013.01); *G01V 11/002* (2013.01); *G06F 17/5009* (2013.01); *E21B 33/12* (2013.01); *E21B 43/14* (2013.01); *E21B 49/00* (2013.01)

(56) References Cited

U.S. PATENT DOCUMENTS

| | | | | |
|---|---|---|---|---|
| 6,584,406 | B1* | 6/2003 | Harmon | E21B 47/14 702/6 |
| 7,571,768 | B2* | 8/2009 | Cuthill | E21B 43/1195 166/297 |
| 2004/0200613 | A1* | 10/2004 | Fripp | E21B 47/0006 166/250.01 |
| 2005/0072565 | A1 | 4/2005 | Segura et al. | |
| 2005/0257611 | A1* | 11/2005 | Fogal | E21B 49/10 73/152.22 |
| 2007/0256832 | A1* | 11/2007 | Hagiwara | G01V 3/28 166/250.16 |
| 2011/0204896 | A1 | 8/2011 | Zhang et al. | |

OTHER PUBLICATIONS

Stolboushkin, Eugene et al., "Novel Electro-Hydraulic Intelligent Firing Head for Tubing Conveyed Perforating", Sep. 30-Oct. 1, 2013, SPE Annual Technical Conference and Exhibition, Society of Petroleum Engineers. (Year: 2013).*

Baumann, Carlos et al. "Gunshock Risk Evaluation when Perforating High Pressure Wells"), Oct. 8-12, 2012, SPE Annual Technical Conference and Exhibition, Society of Petroleum Engineers. (Year: 2012).*

Morriss, S. L. et al. "Measurement of Velocity Profiles in Upwards Oil/Water Flow Using Ultrasonic Doppler Velocimetry", Oct. 6-9, 1991, 66th Annual Technical Conference and Exhibition, Society of Petroleum Engineers. (Year: 1991).*

International Search Report and Written Opinion dated Sep. 29, 2014, for PCT Application No. PCT/US2013/078488 filed on Dec. 31, 2013.

* cited by examiner

FAST TEST APPLICATION FOR SHOCK SENSING SUBASSEMBLIES USING SHOCK MODELING SOFTWARE

FIELD OF THE INVENTION

The present disclosure relates generally to the validation of models for predicting a transient response of a subterranean formation, and more specifically to methods and systems for validating such models by operating shock sensing subassemblies that monitor the transient response of the formation in response to certain stimuli as viewed in terms of, for example, the rate of change of pressure in a portion of the formation.

DISCUSSION OF THE RELATED ART

As the process for forming wells to recover oil and gas becomes more complex, the ability to accurately predict the formation response to a variety of stimuli is highly beneficial in refining well formation processes, estimating formation properties adjacent a wellbore, and identifying locations for additional wells.

Validating a model may be time consuming, however, because many of the tests used to yield data about the formation properties, such as drill stem testing and shut-in testing, are time consuming and frequently involve interruption of the well formation process; removing equipment from the well; and adding test-specific equipment to the well to conduct extensive testing.

BRIEF DESCRIPTION OF THE DRAWINGS

Illustrative embodiments of the present invention are described in detail below with reference to the attached drawing figures, which are incorporated by reference herein and wherein.

The illustrated figures are only exemplary and are not intended to assert or imply any limitation with regard to the environment, architecture, design, or process in which different embodiments may be implemented.

DETAILED DESCRIPTION

In the following detailed description of the illustrative embodiments, reference is made to the accompanying drawings that form a part hereof. These embodiments are described in sufficient detail to enable those skilled in the art to practice the invention. It is understood that other embodiments may be utilized and that logical structural, mechanical, electrical, and chemical changes may be made without departing from the spirit or scope of the invention. To avoid detail not necessary to enable those skilled in the art to practice the embodiments described herein, the description may omit certain information known to those skilled in the art. The following detailed description is, therefore, not to be taken in a limiting sense, and the scope of the illustrative embodiments is defined only by the appended claims.

Figure 1:
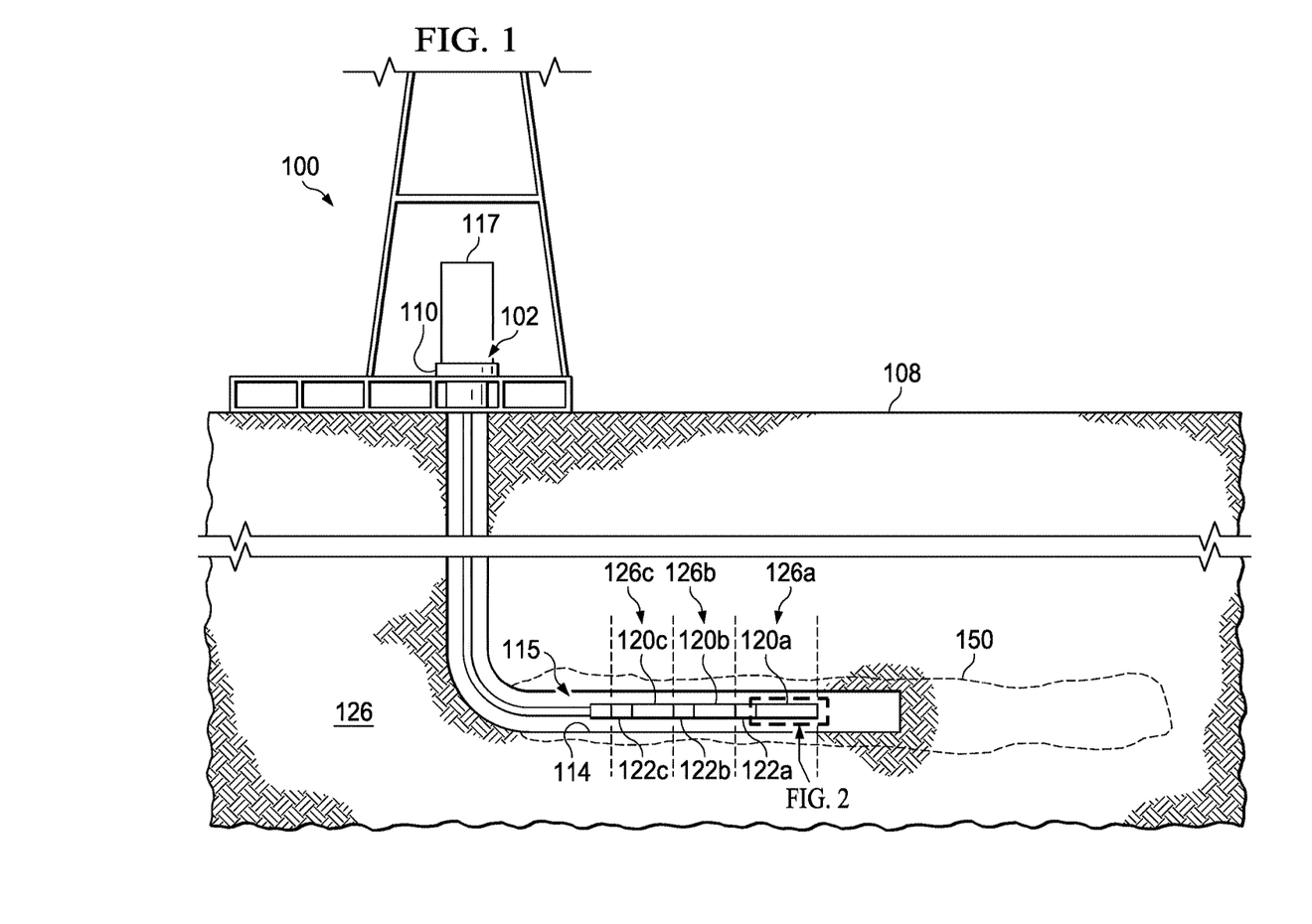
FIG. 1 is a schematic, side view of a tool string having a plurality of shock sensing subassemblies extending into a wellbore.

Referring now to the figures, FIG. 1 is a schematic view 100 of a well 102 in which a bore hole 114 extends from the surface 108 through a formation 126. A perforation string 115 has been deployed within the wellbore 114 and is coupled to a control system 117 at the sealed well head 110. More particularly, the perforation string 115 is deployed within a target zone 150 of the well 102. As shown in FIG. 1, the target zone 150 includes multiple zones, a first zone 126 a, a second zone 126 b, and a third zone 126 c, having perforating guns 120 a-c and shock sensing subassemblies 122 a-c, respectively. The zones 126 a-c may be formed to include multiple additional zones or fewer zones.

As shown in FIGS. 2-9, the perforation string 115 includes a packer 216, a firing head, perforating guns 220a-c and shock sensing subassemblies 222a-c. In another embodiment, the perforating string 212 may include more or less of these components. For example, well screens and/or gravel packing equipment may be provided, any number (including one) of the perforating guns 220a-c and shock sensing subassemblies 222a-c may be provided. In an embodiment, a packer 216 may be included between each shock sensing subassembly to isolate the shock sensing subassemblies from one another.

Figure 2:
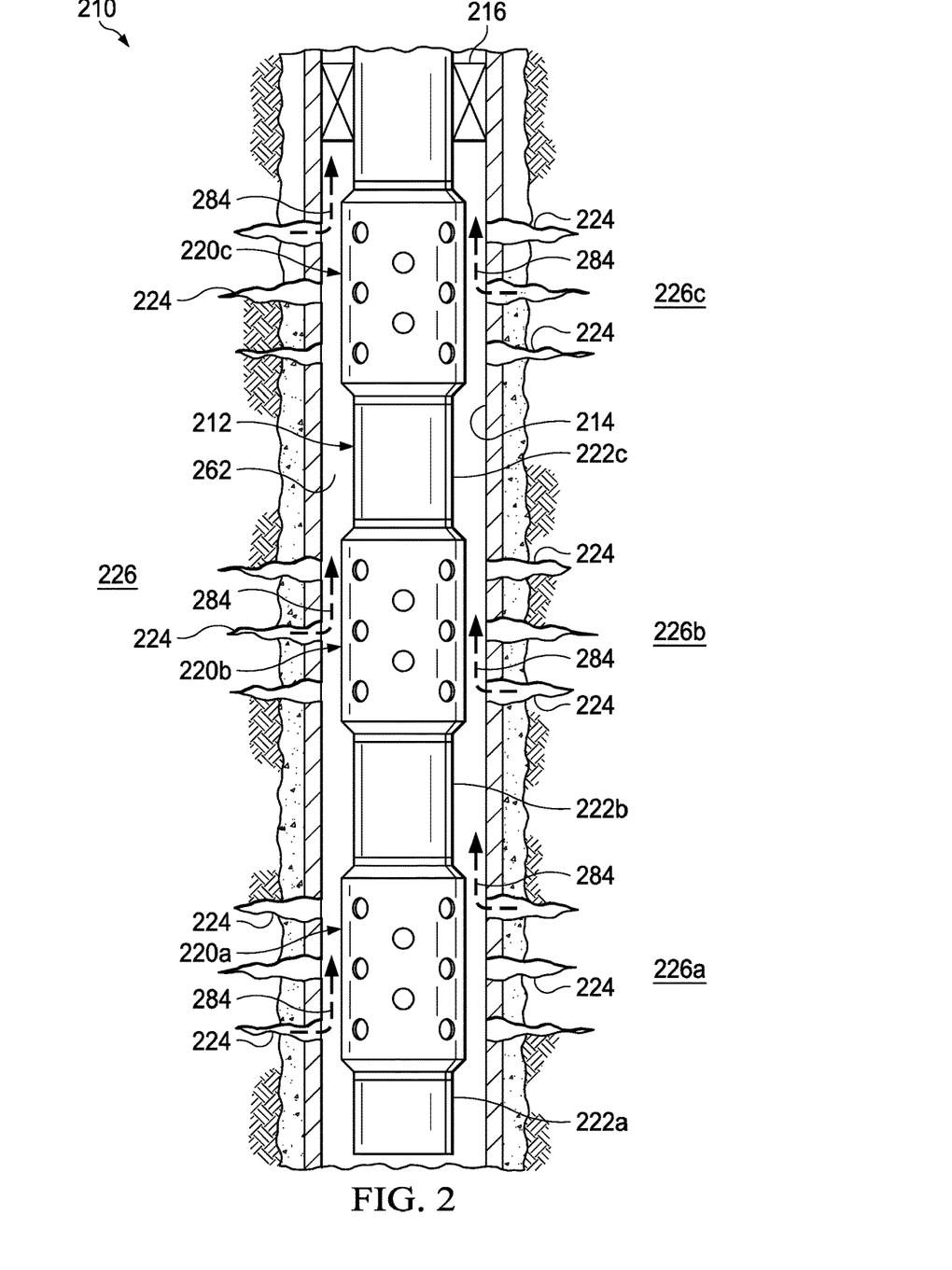
FIG. 2 is a schematic, side view showing a portions of a perforation tool string having a plurality of shock sensing subassemblies deployed within the wellbore following a perforation of the wellbore.
Figure 3:
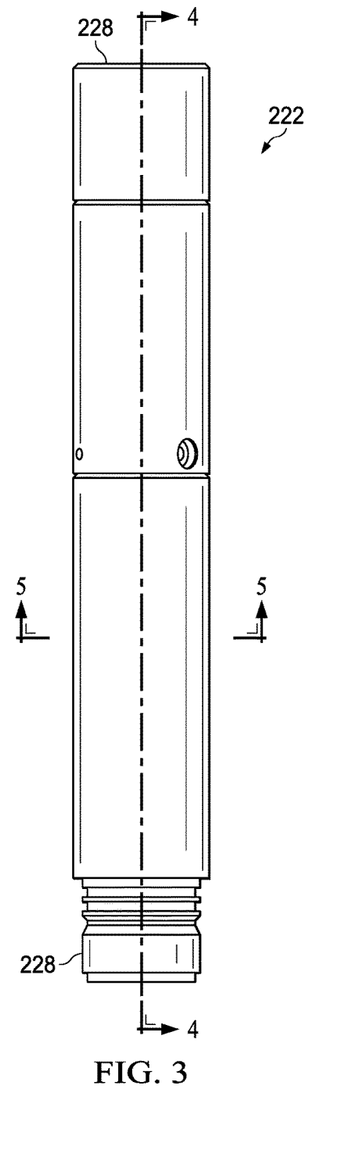
FIG. 3 is a side view of a shock sensing subassembly.

The shock sensing subassemblies 222a-c are located below the packer 216 and in close proximity to the perforating guns 220a-c to obtain more accurate measurements of strain and acceleration at the locus of the perforating guns 220a-c. Pressure and temperature sensors of the shock sensing subassemblies 222a-c can also sense conditions in the wellbore 214 in close proximity to perforations 224 immediately after the perforations 224 are formed, thereby facilitating more accurate analysis of characteristics of the portions or zones of the formation 226 that have been penetrated by the perforations 224.

The shock sensing subassembly 222, is interconnected beneath the packer 216 and between the upper perforating gun 220c and intermediate perforating gun 220b. The shock sensing subassembly 222c may record the effects of perforating on the perforating string 212 near the perforating guns 220a-c or on the perforating guns 220a-c themselves.

The shock sensing subassembly 222a may be connected below the lower perforating gun 220a, if desired, to record the effects of perforating at this location. In other examples, the perforating string 212 could be stabbed into a lower completion string, connected to a bridge plug or packer at the lower end of the perforating string, or otherwise assembled to the perforating string 212.

The placement of the shock sensing subassemblies 222a-b spaced along the perforating string 212 allows acquisition of data at various points in the target zone 150, and data acquisition from multiple zones 226a-c within the target zone 150. The acquired data may be useful for a number of purposes, as described in more detail below.

Referring additionally now to FIGS. 3-6, an example of the shock sensing subassembly 222 is shown. In an embodiment, the shock sensing subassembly 222 includes end connectors 228 (such as perforating gun connectors, etc.) for connecting the shock sensing subassembly 222 to adjacent elements in the perforating string 212. Other types of connectors may also be used to facilitate the use of the shock sensing subassembly in other types of tool strings, such as a drill string, wireline tool string, or slickline tool string.

Figure 4:
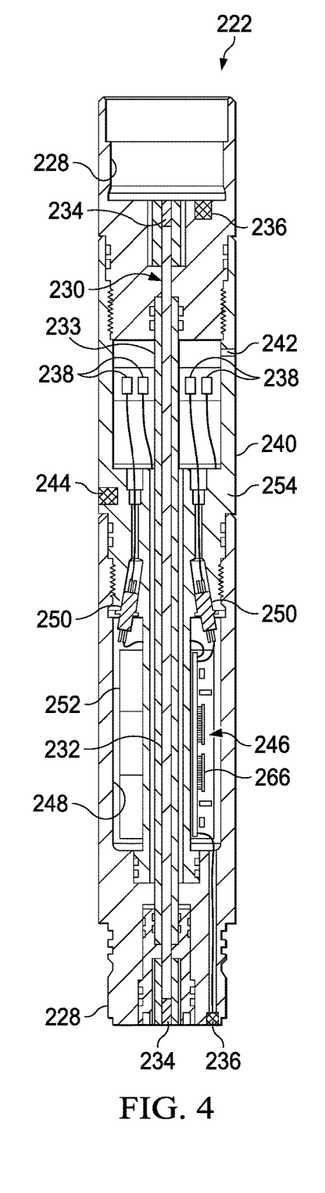
FIG. 4. Is a side, cross-section view of the shock sensing subassembly taken along the lines 4-4 shown in FIG. 3.

FIG. 4 shows a cross-sectional view of the shock sensing subassembly 222, which has a variety of sensors and a detonation train 230 that extends through the interior of the shock sensing subassembly 222. The detonation train 230 can transfer a detonation signal between perforating guns 220a-c, between a firing head (not shown) and a perforating gun, and/or between any other explosive components in the perforating string 212. The detonation train 230 may include a detonating cord 232 and explosive boosters 234 or other similar components.

The shock sensing subassembly 222 may include one or more pressure sensors 236 to sense pressure in perforating guns and firing heads attached to the connectors 228. In an embodiment, the pressure sensors 236 are ruggedized to withstand, for example, at least 20,000 g of acceleration and are capable of transmitting high-bandwidth communications of, for example, 20 kHz. The pressure sensors 236 may sense pressures of up to 60 ksi (414 MPa) and withstand temperatures of up to at least 175° C. The pressure sensor specifications, however, may vary depending on the expected accelerations, forces, pressures, and temperatures that the pressure sensors are expected to endure.

In an embodiment, strain sensors 238 are attached to an inner surface of a generally tubular structure 240 between the connectors 228. In an embodiment, the internal portion of the structure 240 may be kept at atmospheric pressure, for example, to facilitate the use of the strain sensors 238 as a mechanism for measuring the pressure of the wellbore. In another embodiment, the structure 240 may be pressure balanced so that there will be substantially no pressure differential across the structure 240. For example, ports 242 may be provided to equalize pressure between an interior and an exterior of the structure 240. By equalizing pressure across the structure 240, the strain sensor 238 measurements are not influenced by any differential pressure across the structure before, during or after detonation of the perforating guns 220a-c. In an embodiment, the strain sensors 238 are preferably foil or wire-type resistance strain gages, although other types of strain sensors (e.g., piezoelectric, piezoresistive, fiber optic, etc.) may be used. In an exemplar embodiment, the strain sensors 238 are mounted to a strip (such as a KAPTON™ strip) for precise alignment, which is then adhered to the interior of the structure 240. In an embodiment, four full Wheatstone bridges are used, with opposing 0 degree (axial) and 90 degree (hoop) oriented strain sensors being used for sensing axial and hoop strains at three positions around the azimuth, 120 degrees apart. Torsional strain is independently measured using +/−45 degree gages. Bending and axial components of strain may be distinguished with this particular array of strain measurements.

The strain sensors 238 may be made of any suitable material that provides thermal compensation and allows for operation up to 150° C. Any type or number of strain sensors 238 may be used in keeping with the principles of this disclosure. The strain sensors 238 may be used in a manner similar to that of a load cell or load sensor, such that loads in the perforating string 212 passing through the structure 240 are measured by the strain sensors 238.

In an embodiment, the shock sensing subassembly 222 further includes a temperature sensor 244, such as a thermistor, thermocouple, resistance temperature detector (RTD), or similar device that can be used to monitor temperature external to the shock sensing subassembly 222. The temperature sensor 244 may measure temperature in the wellbore 214 adjacent the shock sensing subassembly 222. Such temperature measurements may be useful in evaluating characteristics of the formation 226 and characteristics of fluid produced from the formation 226 following detonation of the perforating guns 220a-c. Temperature measurements may also be useful in detecting flow behind the well casing, cross-flow between formation zones 226a and 226b, temperature variations from a thermal gradient in the formation 226, and temperature variations between zones 226a and 226b. In an embodiment, the temperature sensor 244 is selected to provide accurate, high-resolution measurements of temperatures up to 170° C.

The shock sensing subassembly 222 may also include a second temperature sensor (not shown) with an electronics package 246 that is positioned in an isolated chamber 248 of the shock sensing subassembly 222. Measurements taken by the second temperature sensor temperature may be used for diagnostic purposes or for thermal compensation of other sensor measurements. For example, measurements taken by the second temperature sensor may be used to correct errors in the outputs of other sensors resulting from temperature change within the shock sensing subassembly 222.

In a pressure balanced embodiment, the electronics package 246 is connected to the strain sensors 238 via pressure isolating bulkhead connectors 250, though the pressure-isolating bulkhead connectors 250 may be omitted in embodiments in which the structure 240 is maintained at atmospheric pressure and the strain sensors 238 and electronics package 246 are directly connected. If necessary, similar connectors may also be used for connecting other sensors to the electronics package 246. Batteries 252 or another power source may be used to provide electrical power to the electronics package 246. Like other elements of the shock sensing subassembly 222, the electronics package 246 and batteries 252 may be ruggedized and mounted within the shock sensing subassembly in a manner that allows them to withstand shock loads of up to 20,000 g. For example, the electronics package 246 and batteries 252 may be potted within the shock sensing subassembly 222 after assembly.

In an embodiment, the speed of sound in a fluid adjacent the shock sensing subassembly 222 may be estimated using the strain gages or pressure sensors described above based on the time of flight of pressure waves that are reflected from a tool, such as a packer, above or below the shock sensing subassembly. In another embodiment, the speed of sound in the wellbore fluid may be estimated by measuring the time of flight of pressure waves between two sensors. For example, the time of flight may be estimated by measuring the time of flight of a pressure wave between a pressure sensor and a strain gage, between two strain gages, or between two pressure sensors.

Applying these concepts, the subassembly is understood to include a system for measuring the speed of sound in a wellbore fluid comprising a signal generator and at least a first sensor at a distance from the signal generator. The system may determine the speed of sound in the fluid by determining the time it takes for a pressure pulse or other signal to propagate through the fluid, either from the signal generator to the first sensor or from the first sensor to a second sensor. Both the first and second sensors may be a pressure sensor, strain gage, or other sensor that is operable to detect the pressure pulse or other signal to record the "time of flight" of the signal from the first location to the second location. The signal, which may be a pressure pulse, may be generated by a perforation gun, a surge chamber, a propellant chamber, or even a coupling to a remote pressure source such as a surface pump or an electric submersible pump (ESP), any of which may be understood to be the signal generator.

In another embodiment, a hydrophone may be included as a sensor element within the shock sensing subassembly 222 to provide measurements that can be used to estimate the speed of sound in the fluid adjacent the shock sensing subassembly 222. Post detonation, when a fluid has entered the wellbore from the formation, the shock sensing subassembly may be operable to determine the speed of sound within the fluid, which may indicate the composition of the fluid as the speed of sound will vary between different fluid types. For example, the estimate of the speed of sound in the fluid may indicate whether wellbore fluid is primarily water or primarily a hydrocarbon fluid, such as oil.

Figure 5:
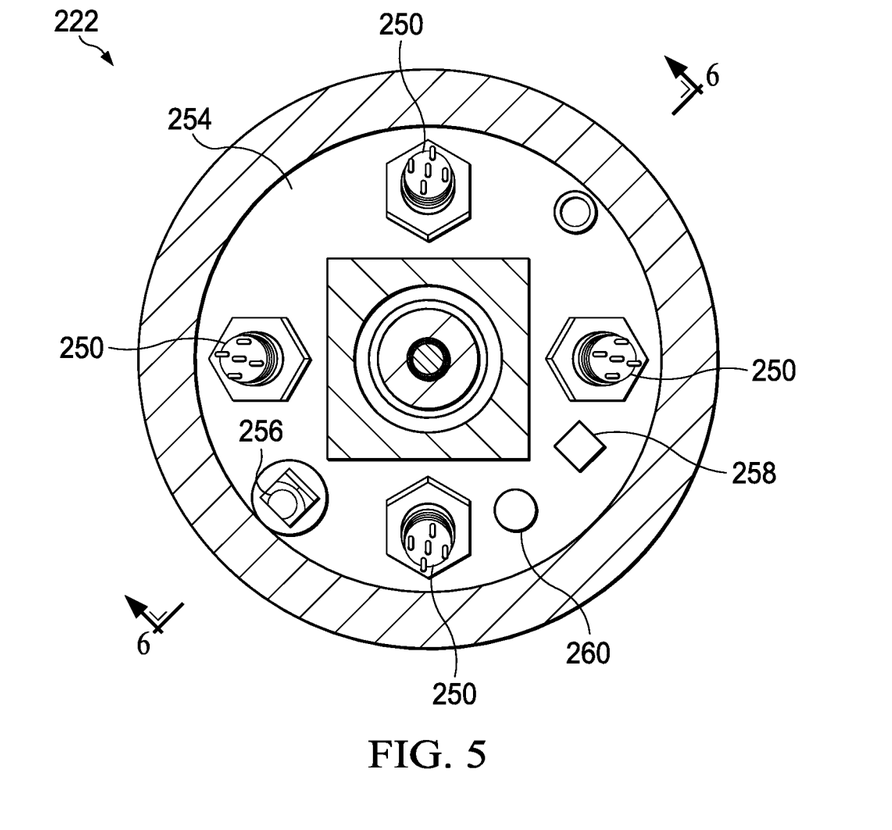
FIG. 5 is atop, cross section view of the shock sensing subassembly of FIG. 3.

In the embodiment of FIG. 5, four connectors 250 are installed in a bulkhead 254 at one end of the structure 240, and a pressure sensor 256, a temperature sensor 258, and an accelerometer 260 are mounted to the bulkhead 254. The pressure sensor 256 monitors pressure external to the shock sensing subassembly 222 in the annulus formed between the perforating string 212 and the wellbore 214. The pressure sensor 256 may be similar to the pressure sensors 236 described above. The temperature sensor 258 monitors temperature within the shock sensing subassembly 222, and may be used in place of, or in addition to, the temperature sensor described above as being included with the electronics package 246. The accelerometer 260 may be a piezoresistive accelerometer or any other suitable type of accelerometer.

Figure 6:
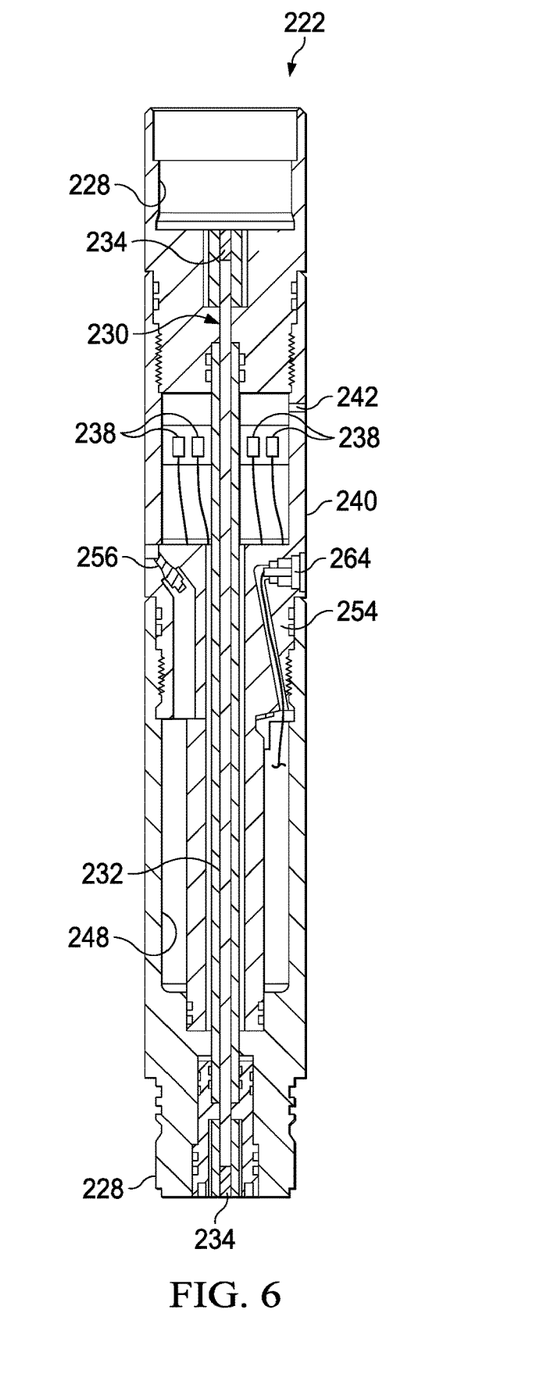
FIG. 6 is a side, cross-section view of the shock sensing subassembly taken along the lines 6-6 shown in FIG. 5.

FIG. 6 shows a second cross-sectional view of the shock sensing subassembly 222 and shows the pressure sensor 256, which may be a transducer, ported to the exterior of the shock sensing subassembly 222. The pressure transducer 256 may be positioned close to an outer surface of the shock sensing subassembly 222 to limit distortion of pressure measurements that may otherwise result from pressure waves being transmitted through the port. FIG. 6 also shows a side port connector 264 that provides for communication with the electronics package 246.

In an embodiment, a surface controller or other computer may be coupled to the electronics package 246 via the connector 264. The coupling may provide for the extraction of recorded sensor measurements from the electronics package 246, programming the electronics package 246 to cause the electronics package 246 to "wake" in response to a particular signal or after a selected time, or otherwise communicating with or exchanging data with the electronics package 246.

When the shock sensing subassembly 222 is added to the perforation string and deployed, a large amount of time may elapse before detonation of the perforating guns 220a-c. To preserve battery power, the electronics package 246 may be configured to operate in a low-power usage "state, which may also be referred to as a sleep" state, until a particular signal is received or until a particular time period has elapsed. The signal which wakes the electronics package 246 may comprise any type of pressure, temperature, acoustic, electromagnetic, or other signal that can be detected by one or more of the sensors 236, 238, 244, 256, 258, 260.

For example, the pressure sensor 256 may detect when a certain pressure level has been achieved or applied external to the shock sensing subassembly 222 or when a particular series of pressure pulses has been applied. In response to the signal, the electronics package 246 can be activated to a higher sampling rate, and measurements from additional sensors can be recorded.

In an embodiment, the electronics package 246 additionally includes a non-volatile memory 266 so that recorded sensor measurements are maintained in memory even if the batteries 252 are discharged and the memory 266 is temporarily without power. The non-volatile memory 266 may be any type of memory which retains stored information when powered off, such as erasable programmable read only memory, flash memory, or any other type of non-volatile memory.

By using a plurality of shock sensing subassemblies 222 having pressure sensors 256 in close proximity to each of multiple zones 226a, 226b, 226c (as shown in FIG. 2), each pressure sensor 256 can measure pressure variations in the wellbore 214 proximate a zone 226a, 226b, 226c, so that the characteristics of the individual zones can be more readily determined. Similarly, other sensors such as strain gages, temperature sensors, hydrophones, fluid-density sensors, viscosity sensors, and spectroscopic or other fluid composition sensors may be used to conduct similar tests in the zone of interest following a detonation or other stimulation event. In an embodiment, the time-scale of the test may vary based on the property being measured and type of sensor used. For example, hydrophones and pressure transducers may be used to measure dynamic pressure and may therefore be sensitive to measurement variations that occur over a relatively short time period, such as, for example, 50 microseconds. Accordingly, it may be useful to conduct tests that monitor the rate of change of pressure over very short periods, such as a second or less, in addition to longer time-scale tests lasting several seconds or longer. Conversely, temperature changes are generally slower, and so a test that includes a measurement of a rate of change of temperature may take place over a period of seconds and use a temperature sensor having a one-second time constant.

In an exemplary method, shut-in and drawdown tests are performed after perforating, wherein the sensors 256 measure pressure in the zone in which they are located. These pressure measurements, along with other sensor measurements, such as temperature measurements or speed of sound measurements, can be used to determine characteristics of the formation in the tested zone 226a, 226b, 226c or a wellbore fluid therein. Such tests may be performed, for example, by causing a rapid pressure change adjacent the sensor and an isolated area of the wellbore (which may correspond to a zone 226a, 226b, 226c) and monitoring the change in pressure over time as the isolated area returns to equilibrium with the formation. In such a test, the rate of change of pressure in the test area may be indicative of nearby formation properties. For example, the rate at which pressure drops after a pressure increase resulting from, for example, a detonation, can be used to determine characteristics of the formation 226.

By distributing temperature sensors 244 along the perforating string 212, temperature variations in the wellbore 214 proximate the zones 226a, 226b, 226c perforated by the guns 220 can be obtained so that the characteristics of the individual zones 226a, 226b, 226c may also be more readily determined. In addition, the temperature sensors 244 may detect variations in temperature that indicate fluid flow outside of the perforating string 212 and temperature variations resulting from a thermal gradient in the formation.

During a shut-in test that is triggered by a detonation, a control signal that is initiated some time after a detonation occurs, activation of a propellant charge, or activation of a surge chamber, it is noted that the temperature sensors 244 will give much more accurate temperature measurements proximate the individual zones 226a, 226b than would be provided by a remotely located temperature sensor. In addition, measurements from the temperature sensors 244 may also be used to detect differences in temperatures between zones and to detect cross-flow between the zones 226a and 226b.

In addition to a shut-in test prompted by the detonation, injection tests may also be performed after perforating. Such an injection test may involve flowing fluid from the wellbore 214 into the formation 226 and its individual zones 226a, 226b. In the injection test, the temperature sensors 244 are operable to detect temperature variations due to the fluid flowing along the wellbore 214 and from the wellbore 214 into the individual zones 226a, 226b so that the flow rate and volume of fluid which flows into the individual zones can be conveniently determined by correlating a reduction in temperature to the flow of injection fluid into the formation 226. This information can be useful, for example, for planning subsequent stimulation operations, including fracturing, acidizing, and applying conformance treatments.

Figure 7:
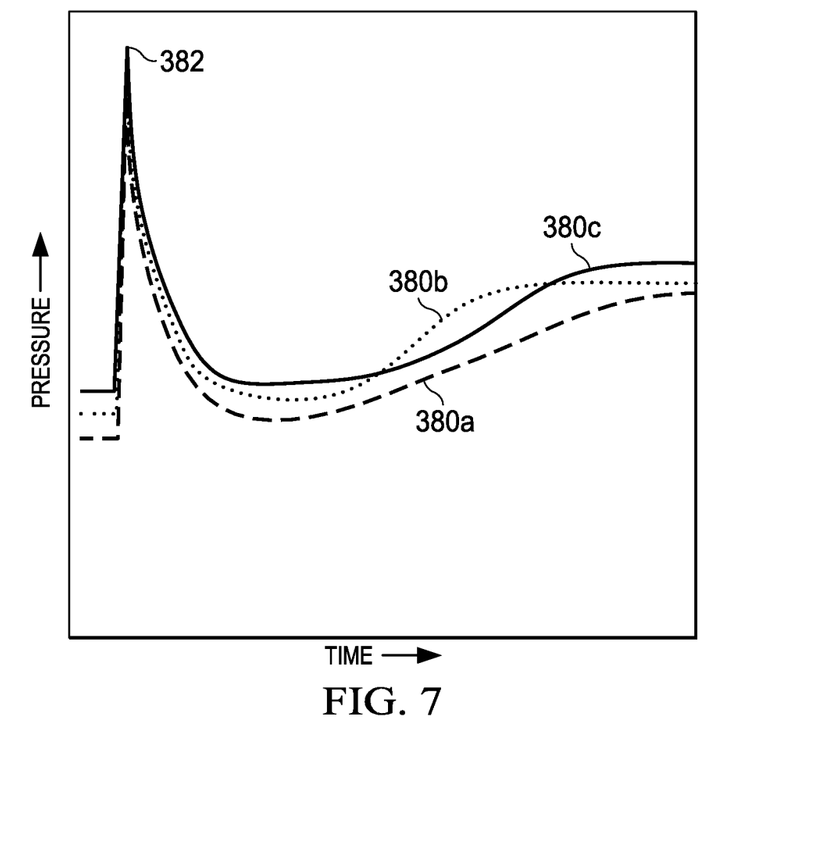
FIG. 7 is a graph showing a representative set of pressure measurements measured by the shock sensing subassemblies of, for example, FIG. 1, following the application of a pressure increase to the wellbore.

FIG. 7 shows a schematic graph of pressure measurements 380a, 380b, and 380c recorded by the three shock sensing subassemblies 222a, 222b, 222c shown in FIG. 2 during a hypothetical test. The pressure measurements 380a, 380b, and 380c do not have the same shape, which would indicate that the individual zones 226a, 226b, and 226c respond differently to the stimulus that was applied when the perforating guns 220a-c were fired. These different pressure responses can be used to evaluate the different characteristics of the individual zones 226a, 226b, and 226c.

For example, all of the pressure sensors 256 of the shock sensing subassemblies 222a, 222b, 222c measured about the same pressure 382 when the guns and 220 were fired. However, soon after firing the guns 220, pressure in the wellbore 114 decreased due to dissipation of the pressure generated by the guns 220. Pressure in the wellbore 114 then gradually increases due to the communication between the zones 226a, 226b, and 226c and the wellbore provided by the perforations 224. Eventually, the pressure in the wellbore 114 at each pressure sensor 256 may stabilize at the pore pressure in the formation 226.

In some cases, variations in the pressures may indicate a fracture closing after the guns 220 are fired. For example, a positive change in the slope of the pressure measurements can indicate a fracture closing, resulting in less bleed-off into the formation 226 when the fracture closes.

The values and slopes (rates of change) of each of the pressure measurements 380a, 380b, 380c can provide information on the characteristics of the individual zones 226a, 226b, and 226c. For example, the pressure measurement 380b has a greater slope following the pressure decrease than the pressure measurements 380a and 380c. This greater slope can indicate greater permeability in the adjacent zone 226b, as compared to the other zones 226a and 226c, due to formation fluid 284 more readily entering the wellbore 114 via the perforations 224 at the second zone 226b. Since the slope of the pressure measurement 380a following the pressure decrease in FIG. 7 is less than that of the other pressure measurements 380b and 380c, it may also be determined that the first zone 226a has less permeability as compared to the other zones 226b and 226c.

Other characteristics of the zones 226a, 226b, 226c can also be determined using the pressure measurements 380a, 380b, 380, such as porosity, pore pressure, perforation tunnel volume, skin, clean out, and other similar characteristics. Temperature measurements may also be useful in this regard.

Although the pressure sensors 256 of the shock sensing subassemblies 222a, 222b, 222c are not necessarily positioned directly opposite the perforations 224 when the guns 220 are fired, in an embodiment, the pressure sensors 256 are located close enough to the perforations for the pressure sensors 256 to measure pressures along the wellbore 114 and enable differentiation between the responses of the zones 226a, 226b, 226c. In this regard, it is noted that the tests may be conducted in a way that maximizes an operator's ability to distinguish between the effects of pressure changes at each zone. For example, in an embodiment in which the guns 220a, 220b, and 220c are detonated at the same time, the time zone over which the pressure responses are monitored may be selected to very short to more closely monitor properties of the formation very close to the sensors of the shock sensing subassemblies 222a, 222b, 222c. Conversely, where the time zone is selected to be longer, an operator may infer that the data gathered is likely to be indicative of formation properties further away from the shock sensing subassemblies 222a, 222b, 222c. The shock sensing subassemblies 222a, 222b, and 222c and their associated pressure, temperature, and other sensors can be used to characterize each of multiple zones 226a, 226b, and 226c along the wellbore 114, and the measurements obtained by the sensors can be used to identify the characteristics of multiple zones. In addition, the detonations may be staggered so that it is easier to determine which perforation gun's detonation resulted in particular transient responses in each zone, including changes in temperature and pressure in each zone.

The sensors can also be used to measure various parameters, including pressure and temperature, at each individual zone before, during, and after the perforating event. For example, the sensors can measure an underbalanced, balanced, or overbalanced condition prior to perforating. In addition, the sensors may measure pressure increases due to, for example, firing the perforating guns 220a-c or applying a stimulation treatment by, for example, initiating a propellant charge in the wellbore. As another example, the sensors can measure pressure decreases and the corresponding wellbore response resulting from the dissipation of pressure following a perforating event or from artificially decreasing the pressure by, for example, opening an empty surge chamber. More generally, the suite of sensors described herein can be used to measure a transient dynamic response to a stimulus before, during, immediately after, or some delayed time after perforating. The transient dynamic response of interest may include rates of change in the various measurements as well as shorter time-scale dynamics or resonances.

Although only three zones 226a, 226b, 226c, perforating guns 220a, 220b, 220c, and shock sensing subassemblies 222a, 222b, 222c are depicted in FIGS. 1 and 2, it should be understood that any number of these elements could exist in systems and methods disclosed herein. Further, it is not necessary for there to be a one-to-one correspondence between the quantities of perforating guns, zones, and shock sensing subassemblies.

Figure 8:
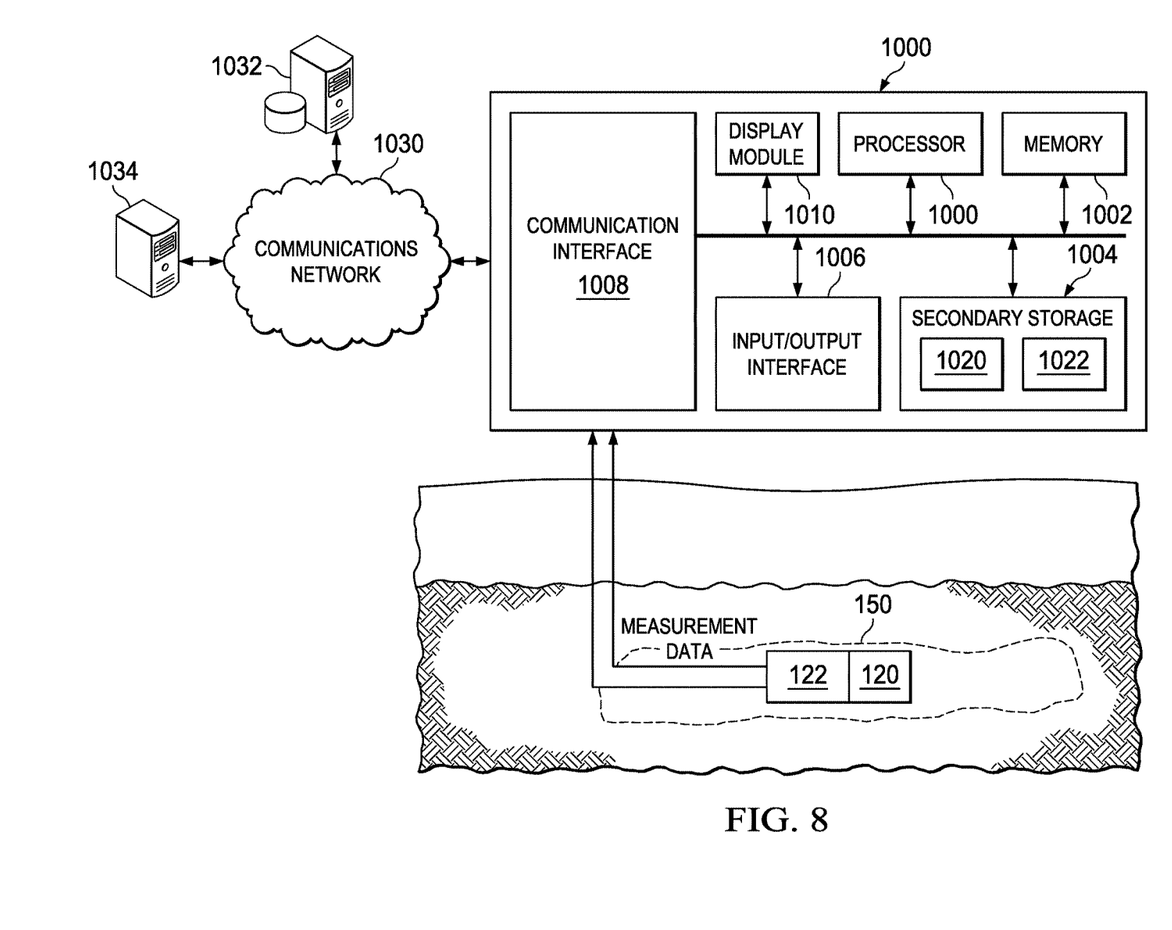
FIG. 8 is a schematic diagram of a modeling subsystem for use in communicating with and extracting data from a shock sensing subassembly.

FIG. 8 shows a representative modeling subsystem 1000 for communicating with and extracting data from a shock sensing subassembly 122. The modeling subsystem 1000 includes a communication interface 1008, which may be a wired or wireless communications interface. In an embodiment, the communication interface 1008 may receive data from a shock sensing subassembly 122 via a wired connection after the shock sensing subassembly has been removed from the wellbore. The communications interface 1008 may also include wired and wireless interfaces to a communications network 1030 to provide for communication with a remote server or computer 1034 and database 1032. Further, the modeling subsystem 1000 includes a display module 1010, a processor 1000, a memory 1002, an input-output interface 1006 or controller, and a secondary storage mechanism 1004 which may include one or more memories 1020, 1022.

In an embodiment, the modeling subsystem 1000 may also include instructions, stored in memory 1002, to cause the processor 1002 to run a predictive modeling process to predict the response of the various zones 126a, 126b, and 126c to a stimulus, such as a detonation, pressure pulse, or activation of a surge chamber. The modeling subsystem 1000 may receive actual test data, including measured pressure data, temperature data, speed of sound data, and transient response data related thereto which may indicate properties of the formation and fluid therein, including permeability, porosity, producibility, skin damage, and fluid type. In an embodiment, the system compares the predicted test data based on the predicted transient response to the measured test data based on the actual transient response and adjusts the modeling process to account for unexpected variances. For example, the modeling process may be tuned to get a better match in terms of expected and measured pressure changes and rates of changes. The parameters of the resulting tuned model may assist in providing a more accurate measurement of fluid, perforation, and/or formation properties by enhancing the accuracy of any assumptions or relatively constant parameters that are taken into account in providing such measurements.

In another embodiment, the unexpected variances are analyzed to determine specific formation properties that differ from the projections of the model. For example, the comparison may be used to generate a report indicating that a particular zone within the formation has more or less permeability than expected, includes an undesirable fluid such as water, or has more or less reserves than expected. This data may be applied not only to adjust the model but also to configure nearby additional wells. For example, if the measurement data extracted from the shock sensing subassembly 122 indicates that the perforation process resulted in skin damage to an area having high reserves, a different perforation process may be selected for an additional, nearby wellbore that does not result in skin damage to the area of high reserves. Such a process may include altering the magnitude of perforations, the placement of perforations, the strength of any dynamic underbalancing mechanism that may be used to clean out perforations, and the order of activation of perforation guns in the various zones of the additional, nearby wellbore.

In an embodiment, the modeling subsystem 1000 may also analyze data extracted from the shock sensing subassembly 122 to determine perforation tunnel volume. By monitoring pressure pulses, speed of sound measurements, and resonance, for example, the modeling subsystem 1000 may determine tunnel volumes, which may indicate additional properties of the formation 126 such as formation density, porosity, etc. In addition, these measurements may also be analyzed to determine whether debris or unwanted inflows of unwanted material have entered the wellbore and may interfere with production. Further, the data may be analyzed to determine whether the perforations are effective in terms of opening productive regions of the formation without causing skin damage or reducing porosity or permeability.

In accordance with the foregoing disclosure, an illustrative system is provided that includes a plurality of perforation guns arranged within a tool string and operable to deploy one or more explosive charges into a plurality of zones in a formation. The system also includes a plurality of shock sensing subassemblies arranged within the tool string. In an embodiment, at least one of the shock sensing subassemblies is proximate a perforation gun. As referenced herein, "proximate" means adjacent or close by.

Each shock sensing subassembly has a power source, a memory, a communications interface, and a sensor. The sensor is operable to measure a transient response of a characteristic of the formation in the zone in which the sensing subassembly is deployed following a stimulation event. Here, the "transient response" is understood to be the change in time, as evidenced by multiple measurements or a continuous sampling of measurements that evidence a rate of change of a formation property. Generally, the transient response is monitored in the annulus between the shock sensing subassembly and the wellbore wall, but the monitored area may also include a cavity formed by detonation of a perforation gun. The characteristic of the formation may be pressure, temperature, inter-connectedness, speed of sound in a fluid in the formation, the amount of reserves, permeability, porosity, or skin damage, and it is understood that certain characteristics may be inferred or determined based on measurements of other characteristics. For example, by monitoring the transient response of pressure and temperature adjacent the formation, an operator may be able to determine other characteristics of the formation, such as the amount of reserves, permeability, porosity, and skin damage. The stimulation event referenced above may be any suitable stimulation event, such as the detonation of an explosive charge in the perforation gun, activation of a propellant charge proximate the sensor, or the activation of an empty surge chamber.

The memory of the shock sensing subassembly is operable to record and store the transient response, and the power source provides power to the memory and the sensor. The system also includes a modeling subsystem having a memory, a processor, and a communications interface. The memory of the modeling subsystem includes instructions for the processor to execute a modeling process for predicting the transient responses of the characteristic of the formation. The modeling subsystem is operable to communicate with the plurality of subassemblies to receive the measured transient responses, compare the measured transient responses to the predicted transient responses, and update the modeling process based on a difference between the measured transient responses and the predicted transient to responses.

The sensing subassemblies may be deployed in multiple zones within a formation and the transient responses of a characteristic of the formation may be monitored in each zone in which the sensing subassemblies are deployed. As such, a first set of subassemblies may be deployed in a first zone, and a second set of subassemblies may be deployed in a second zone. To determine a transient response of the formation in each zone, a first stimulation event may be initiated proximate the first zone at a first time, and a second stimulation event may be initiated proximate the second zone at a second time. In such an embodiment, the transient response resulting from the first stimulation event may be monitored in the first zone and second zone, and the transient response resulting from the second stimulation event may be monitored in the first zone and second zone. Such an arrangement may assist an operator in determining the extent to which each zone is interconnected with the other zone or the extent to which there is cross-communication between the first zone and second zone.

The modeling subsystem may be operable to predict the transient response of a formation property, such as pressure, temperature, or a characteristic dependent therefrom, such as porosity, degree of cross-communication, tunnel volume, or skin damage. The model may also be operable to compare the predicted transient response to a measured transient response, and to tune the model to predict a higher or lower value for future predicted transient response values based on the comparison.

For example, the modeling subsystem may be operable to predict the extent to which there is cross-communication between the first zone and second zone and compare the predicted amount of cross-communication between the first zone and second zone to the indicated amount of cross-communication between the first zone and second zone. Further, the modeling subsystem may update the modeling process based on the difference between the predicted amount of cross-communication between the first zone and second zone and the indicated amount of cross-communication between the first zone and second zone.

For example, if the difference between the predicted amount of cross-communication between the first zone and second zone and the indicated amount of cross-communication between the first zone and second zone is positive, then the modeling subsystem may tune the model "up" such that, based on a future prediction under similar circumstances and formation properties, a higher degree of cross-communication will be predicted.

In another embodiment, a method for estimating a characteristic of a geological formation includes predicting a transient response of a characteristic of a zone of a formation using a processor of a modeling subsystem to execute a modeling process. The method also includes using a sensor arranged within a tool string proximate a perforation gun within the zone to obtain a measured transient response of the characteristic following a stimulation event and recording and storing the measured transient response in a memory coupled to the sensor. The measured transient response is communicated to the modeling subsystem via a communications interface of the modeling subsystem. In addition, the processor of the modeling subsystem compares the measured transient response to the predicted transient response and updates the modeling process by, for example, increasing or decreasing future predicted values based on a difference between the measured transient response and the predicted transient response.

The sensor may be operable to measure the transient response of the characteristic at a fast sampling rate and a slow sampling rate following a stimulation event of any of the types described above. In such an embodiment, the measured transient response taken at the fast sampling rate may be associated with a region of the formation that is proximate the sensor, and the measured transient response taken at the slow sampling rate may be associated with a region of the formation that is distant from the sensor relative to the proximate region. For example, a sampling rate of 10 kHz or higher, which may be understood to be a fast sampling rate, would allow for measurement of local responses of the perforation tunnels and nearby formation behavior on the order of milliseconds. That said, data collected at a high sampling rate may still be used to provide information required for evaluating moderate or slow parameters, so long as the duration of the data captured is sufficiently long. For example, a sampling rate of 1 kHz, which may be described as moderate sampling rate, would provide 10-millisecond timescale responses for nearby wellbore and formation. As another example, a sampling rate of 10 Hz, which may be described as a slow sampling rate, would provide 1-second timescale responses for slower transient behavior and deeper formation properties.

According to another illustrative embodiment, a shock sensing subassembly is sized and configured to be installed in a perforation string proximate a perforation gun. As described above, the shock sensing subassembly has a power source, a memory, a sensor, and a communications interface. The sensor of the subassembly is operable to measure a transient response of a characteristic of the formation in the zone in which the sensing subassembly is deployed following a stimulation event. In such an embodiment, the memory is operable to record and store the transient response, and the power source provides power to the memory and the sensor. In addition, the communications interface is operable to communicate the measured transient response to a modeling subsystem.

As described above, the monitored characteristic may be temperature, pressure, the speed of sound of a fluid proximate the sensor, or any related characteristic, and the sensor may be one or more of a temperature sensor, pressure transducer, strain gage, or other similar sensor. In addition, the sensor may be operable to measure the transient response of the characteristic at a fast sampling rate and a slow sampling rate.

The illustrative systems, methods, and devices described herein may also be described by the following examples:

Example 1

A system comprising:
  at least one shock sensing subassembly having a sensor operable to measure a transient response of a characteristic of a formation following a stimulation event; and
  a modeling subsystem having:
    a processor;
    a communications interface for receiving the measured transient response; and
    a memory including instructions to direct the processor to generate a predicted transient response of the characteristic;
  wherein the modeling subsystem is operable to receive the measured transient response, compare the measured transient response to the predicted transient response, and update the instructions based on a difference between the measured transient response and the predicted transient response.

Example 2

The system of example 1, wherein the shock sensing subassembly further comprises a sensor memory operable to record and store the measured transient response, and a power source to provide power to the sensor and the sensor memory.

Example 3

The system of example 1 or 2, wherein the modeling subsystem is operable to update the instructions in response to one of: user input of the measured transient response, receiving the measured transient response via a wired communications interface, and receiving the measured transient response via a wireless communications interface.

Example 4

The system of any of examples 1-3, wherein the stimulation event is generated in a zone proximate the shock sensing subassembly.

Example 5

The system of any of examples 1-4, wherein the at least one shock sensing subassembly comprises a plurality of shock sensing subassemblies, each of the shock sensing subassemblies being operable to measure the transient response of the characteristic in a zone in which the shock sensing subassembly is deployed.

Example 6

The system of any of examples 1-5, wherein the characteristic of the formation is the temperature of the formation proximate the sensor.

Example 7

The system of any of examples 1-5, wherein the characteristic of the formation is the pressure in a zone in which the sensor is deployed.

Example 8

The system of any of examples 1-5, wherein the characteristic is a property of a fluid produced by the formation, such property being selected from the group consisting of viscosity, density, speed of sound, compressibility, and fluid component concentration.

Example 9

The system of any of examples 1-8, wherein the stimulation event is selected from the group consisting of detonating a charge, initiating a propellant, and activating a surge chamber.

Example 10

The system of any of examples 1-9, where in the stimulation event is delayed by a preselected amount of time from the detonating of a charge by a perforation gun.

Example 11

The system of examples 1-10, wherein:
a first sensing subassembly is deployed in a first zone, and a second subassembly is deployed in a second zone, and
the stimulation event comprises a first stimulation event proximate the first zone at a first time and a second stimulation event proximate the second zone at a second time, and
the measured transient response of the characteristic comprises a first measured transient response to the first stimulation event in the first zone and second zone and a second measured transient response to the second stimulation event in the first zone and second zone.

Example 12

The system of example 11, wherein the measured transient response indicates the extent to which there is cross-communication between the first zone and second zone, and wherein the modeling subsystem is operable to:
predict the extent to which there is cross-communication between the first zone and second zone;
compare the predicted amount of cross-communication between the first zone and second zone to an indicated amount of cross-communication between the first zone and second zone, the indicated amount of cross-communication being determined based on the measured transient response; and
update the modeling process based on a difference between the predicted amount of cross-communication between the first zone and second zone and the indicated amount of cross-communication between the first zone and second zone.

Example 13

A method to estimate a characteristic of a geological formation, the method comprising:
executing a modeling process to generate a predicted transient response of the characteristic using a modeling subsystem;
obtaining a measured transient response of the characteristic following a stimulation event using a sensor deployed within the formation;
communicating the measured transient response to the modeling subsystem;
using the modeling subsystem to compare the measured transient response to the predicted transient response; and
updating the modeling process based on a difference between the measured transient response and the predicted transient response.

Example 14

The method of example 13, wherein the stimulation event comprises detonating a charge of a perforation gun.

Example 15

The method of any of examples 13-14, wherein the stimulation event comprises activating a surge chamber.

Example 16

The method of any of examples 13-14, wherein the stimulation even comprises initiating a propellant charge.

Example 17

The method of any of examples 13-16, wherein the sensor is arranged within a tool string proximate a perforation gun.

Example 18

The method of any of examples 13-17, further comprising recording and storing the measured transient response in a memory coupled to the sensor.

Example 19

The method of any of examples 13-18, wherein the sensor is operable to measure the transient response of the characteristic at a first sampling rate and a second sampling rate that is slower than the first sampling rate, and wherein the first sampling rate and second sampling rate are selected based on the characteristic to be measured and the distance over which the characteristic is to be measured.

Example 20

The method of example 19, wherein obtaining a measured transient response of the characteristic following a stimulation event comprises obtaining the measured transient response at the first sampling rate and the second sampling rate.

Example 21

The method of example 20, further comprising associating the measured transient response taken at the first sampling rate with a region of the formation that is proximate the sensor and associating the measured transient response taken at the second sampling rate with a region of the formation that is distant from the sensor relative to the proximate region.

Example 22

A shock sensing subassembly having:
- a sensor operable to obtain a measured transient response of a characteristic of a geological formation following a stimulation event;
- a memory operable to record and store the measured transient response of the characteristic;
- a communications interface operable to transmit the measured transient response; and
- a power source to provide power to at least the sensor and the memory.

Example 23

The shock sensing subassembly of example 22, wherein the transient response of the characteristic relates to a zone in a wellbore in which the sensor is deployed.

Example 24

The shock sensing subassembly of any of examples 22-23, wherein the subassembly is sized and configured to be installed in a perforation string proximate a perforation gun.

Example 25

The shock sensing subassembly of any of examples 22-24, wherein the characteristic of the formation comprises temperature, and wherein the sensor comprises a temperature sensor.

Example 26

The shock sensing subassembly of any of examples 22-24, wherein the characteristic of the formation comprises pressure, and wherein the sensor comprises a pressure transducer.

Example 27

The shock sensing subassembly of any of examples 22-24, wherein the characteristic of the formation comprises pressure, and wherein the sensor comprises a hydrophone.

Example 28

The shock sensing subassembly of any of examples 22-24, wherein the characteristic of the formation comprises pressure, and wherein the sensor comprises a strain gage.

Example 29

The shock sensing subassembly of any of examples 22-28, further comprising one or more additional sensors, and wherein the subassembly is operable to measure the pressure in a wellbore in which the subassembly is deployed, the temperature of a fluid in the wellbore, and the speed of sound in the fluid.

Example 30

The shock sensing subassembly of any of examples 22-29, wherein the stimulation event is selected from the group consisting of detonating a charge, initiating a propellant, and activating a surge chamber.

Example 31

The shock sensing subassembly of any of examples 22-30, wherein the sensor is operable to measure the transient response of the characteristic at a first sampling rate and a second sampling rate, the first sampling rate being faster than the second sampling rate.

Example 32

A system for measuring the speed of sound in a wellbore fluid, the system comprising:
- a signal generator; and
- a first sensor at a first distance from the signal generator, and a second sensor of a second distance from the signal generator wherein the system is operable to determine the time delay from the time a signal travels from one of (a) the signal generator and the first sensor and (b) the first sensor and second sensor.

Example 33

The system of example 32, wherein the signal generator is selected from the group consisting of: a perforation gun, a surge chamber, a propellant chamber, and an ESP.

Example 34

The system of any of examples 32-33, wherein the first sensor is a pressure sensor.

Example 35

The system of any of examples 32-33, wherein the first sensor is a strain gage.

Example 36

The system of any of examples 32-35, wherein the second sensor is a pressure sensor.

Example 37

The system of any of examples 32-35, wherein the second sensor is a strain gage.

It should be apparent from the foregoing that an invention having significant advantages has been provided. While the invention is shown in only a few of its forms, it is not limited to only these embodiments but is susceptible to various changes and modifications without departing from the spirit thereof.

As used herein, the singular forms "a", "an" and "the" are intended to include the plural forms as well, unless the context clearly indicates otherwise. It will be further understood that the terms "comprise" and/or "comprising," when used in this specification and/or the claims, specify the presence of stated features, integers, steps, operations, elements, and/or components, but do not preclude the presence or addition of one or more other features, integers, steps, operations, elements, components, and/or groups thereof. The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description but is not intended to be exhaustive or limited to the invention in the form disclosed. Many modifications and variations will be apparent to those of ordinary skill in the art without departing from the scope and spirit of the invention. The embodiment was chosen and described to explain the principles of the invention and the practical application and to enable others of ordinary skill in the art to understand the invention for various embodiments with various modifications as are suited to the particular use contemplated. The scope of the claims is intended to broadly cover the disclosed embodiments and any such modification.

We claim:

1. A system comprising:
   at least one shock sensing subassembly having two or more sensors that measures a transient response resulting from a stimulation event, wherein the subassembly measures a pressure in an annulus formed by the subassembly and a wellbore in which the shock sensing subassembly is deployed, a temperature of a fluid in the annulus, and a speed of sound in the fluid in the annulus, and wherein the transient response indicates a characteristic of a formation; and
   a modeling subsystem having:
   a processor;
   a communications interface for receiving the measured transient response; and
   a memory comprising a predicted characteristic of the formation and instructions to direct the processor to generate a predicted transient response based on the predicted characteristic;
   wherein the modeling subsystem receives the measured transient response, compare the measured transient response to the predicted transient response, update the predicted characteristic of the formation based on a difference between the measured transient response and the predicted transient response, and predict a transient response based on the predicted characteristic.

2. The system of claim 1, wherein the shock sensing subassembly further comprises a sensor memory that records and stores the measured transient response, and a power source to provide power to the sensor and the sensor memory.

3. The system of claim 1, wherein the modeling subsystem is updates the instructions in response to one of: user input of the measured transient response, receiving the measured transient response via a wired communications interface, and receiving the measured transient response via a wireless communications interface.

4. The system of claim 1, wherein the at least one shock sensing subassembly comprises a plurality of shock sensing subassemblies and each of the shock sensing subassemblies measures the transient response of the characteristic in a zone in which the shock sensing subassembly is deployed.

5. The system of claim 1, wherein the characteristic of the formation is selected from the group consisting of the temperature of the formation proximate the sensor, the pressure in a zone in which the sensor is deployed, and a property of a fluid produced by the formation.

6. The system of claim 1, wherein the stimulation event is selected from the group consisting of detonating a charge, initiating a propellant, and activating a surge chamber.

7. The system of claim 1, where in the stimulation event is delayed by a preselected amount of time from the detonating of a charge by a perforation gun.

8. A method to estimate a characteristic of a geological formation, the method comprising:
   executing a modeling process to generate a predicted transient response of a predicted characteristic using a modeling subsystem;
   obtaining a measured transient response resulting from a stimulation event via a first sensor and a second sensor, wherein the first sensor, the second sensor, or combination measures a pressure in an annulus formed by the subassembly and a wellbore in which the subassembly is deployed, a temperature of a fluid in the annulus, and a speed of sound in the fluid in the annulus, and wherein the transient response indicates the characteristic;
   communicating the measured transient response to the modeling subsystem;
   using the modeling subsystem to compare the measured transient response to the predicted transient response; and
   updating the modeling process based on a difference between the measured transient response and the predicted transient response.

9. The method of claim 8, wherein the sensors are arranged within a tool string proximate a perforation gun.

10. The method of claim 8, further comprising recording and storing the measured transient response in a memory coupled to the sensors.

11. The method of claim 8, wherein the stimulation event comprises a stimulation event selected from the group consisting of: detonating a charge of a perforation gun, activating a surge chamber, and initiating a propellant charge.

12. The method of claim 8, wherein:
   the sensors measure the transient response of the characteristic at a first sampling rate and a second sampling rate that is slower than the first sampling rate;
   the first sampling rate and second sampling rate are selected based on the characteristic to be measured and the distance over which the characteristic is to be measured; and obtaining a measured transient response of the characteristic following a stimulation event comprises obtaining the measured transient response at the first sampling rate and the second sampling rate.

13. A shock sensing subassembly comprising:
a sensor that obtains a measured transient response resulting from a stimulation event, wherein the transient response indicates a characteristic of a geological formation;
a memory that records and stores the measured transient response of the characteristic;
a communications interface that transmits the measured transient response;
a power source to provide power to at least the sensor and the memory; and
one or more additional sensors, and wherein the subassembly measures the pressure in a wellbore in an annulus formed by the subassembly and a wellbore in which the subassembly is deployed, the temperature of a fluid in the annulus, and the speed of sound in the fluid in the annulus.

14. The shock sensing subassembly of claim 13, wherein the transient response of the characteristic relates to a zone in a wellbore in which the sensor is deployed.

15. The shock sensing subassembly of claim 13, wherein the characteristic of the formation comprises temperature, and wherein the sensor comprises a temperature sensor.

16. The shock sensing subassembly of claim 13, wherein the characteristic of the formation comprises pressure, and wherein the sensor comprises a pressure transducer.

17. The shock sensing subassembly of claim 13, wherein the characteristic of the formation comprises pressure, and wherein the sensor comprises a hydrophone.

18. The shock sensing subassembly of claim 13, wherein the characteristic of the formation comprises pressure, and wherein the sensor comprises a strain gage.

19. The shock sensing subassembly of claim 13, wherein the stimulation event is selected from the group consisting of detonating a charge, initiating a propellant, and activating a surge chamber.

20. A system for measuring a speed of sound in a wellbore fluid, the system comprising:
a signal generator; and
first sensor at a first distance from the signal generator, and a second sensor of a second distance from the signal generator wherein the system determines a time delay from a time a signal travels from one of (a) the signal generator and the first sensor and (b) the first sensor and second sensor, and wherein the first sensor, the second sensor, or combination thereof measures pressure in an annulus formed by the first sensor and a wellbore in which a subassembly is deployed, a temperature of a fluid in the annulus, and the speed of sound in the fluid in the annulus.

21. The system of claim 20, wherein the signal generator is selected from the group consisting of a perforation gun, a surge chamber, a propellant chamber, and an electric submersible pump.

22. The system of claim 20, wherein the first sensor is a pressure sensor.

23. The system of claim 20, wherein the first sensor is a strain gage.

24. The system of claim 20, wherein the second sensor is a pressure sensor.

25. The system of claim 20, wherein the second sensor is a strain gage.

* * * * *